(12) United States Patent
Suzuki et al.

(10) Patent No.: US 7,589,446 B2
(45) Date of Patent: Sep. 15, 2009

(54) SURFACE MOUNT TYPE VIBRATION MOTOR AND FIXATION STRUCTURE

(75) Inventors: Toshio Suzuki, Kanagawa (JP); Tomohide Aoyagi, Saitama (JP); Takeshi Kogawa, Tokyo (JP)

(73) Assignee: Namiki Seimitsu Houseki Kabushiki Kaisha (JP)

( * ) Notice: Subject to any disclaimer, the term of this patent is extended or adjusted under 35 U.S.C. 154(b) by 360 days.

(21) Appl. No.: 11/658,316

(22) PCT Filed: Aug. 4, 2005

(86) PCT No.: PCT/JP2005/014301
§ 371 (c)(1),
(2), (4) Date: Jan. 24, 2007

(87) PCT Pub. No.: WO2006/016518
PCT Pub. Date: Feb. 16, 2006

(65) Prior Publication Data
US 2008/0309180 A1    Dec. 18, 2008

(30) Foreign Application Priority Data
Aug. 10, 2004   (JP)   ............................. 2004-233573

(51) Int. Cl.
  *H02K 7/06*   (2006.01)
  *H02K 7/075*  (2006.01)
  *H02K 7/065*  (2006.01)
(52) U.S. Cl. .......................................... 310/81; 310/91
(58) Field of Classification Search .................. 310/81, 310/91
See application file for complete search history.

(56) References Cited

U.S. PATENT DOCUMENTS 5,835,006 A * 11/1998 Michalak et al. ......... 340/407.1
5,986,367 A * 11/1999 Tsuzaki et al. ................ 310/71

(Continued)

FOREIGN PATENT DOCUMENTS

EP           840424 A1 *  5/1998

(Continued)

OTHER PUBLICATIONS

International Search Report dated Sep. 6, 2005.

*Primary Examiner*—Burton Mullins
(74) *Attorney, Agent, or Firm*—Studebaker & Brackett PC; Donald R. Studebaker

(57) ABSTRACT

In a solder reflow process, a vibration motor is stably mounted on a circuit board by changing the design of a partial shape of a soldered motor holder without changing the design of a vibration motor body and securing a sufficient soldering area to completely perform solder bonding to prevent a soldered portion of a motor holder from peeling off the circuit board. A surface mount type vibration motor is provided, wherein the pedestals of a motor holder include the support plates that are in contact with stationary lands on a surface of a circuit board and extend in the axial direction of an output shaft, end portions of the support plates are arranged between the position of an eccentric weight and the end surface of the eccentric weight along the axial direction, and the support plates are not arranged just under an axis of said output shaft where the distance between the weight and the circuit board is minimum.

3 Claims, 2 Drawing Sheets

U.S. PATENT DOCUMENTS

| | | | |
|---|---|---|---|
| 6,081,055 A | * | 6/2000 | Narusawa ............. 310/81 |
| 6,133,657 A | * | 10/2000 | Semenik et al. ........ 310/81 |
| 6,495,939 B1 | * | 12/2002 | Yamaguchi et al. ..... 310/81 |
| 6,740,999 B1 | * | 5/2004 | Segawa ............... 310/81 |
| D534,121 S | * | 12/2006 | Morita et al. ......... D13/112 |
| 2006/0284501 A1 | * | 12/2006 | Takagi et al. ......... 310/81 |
| 2007/0241626 A1 | * | 10/2007 | Suzuki et al. ......... 310/71 |

FOREIGN PATENT DOCUMENTS

| | | | |
|---|---|---|---|
| JP | 3004537 | * | 9/1994 |
| JP | 08-107647 | | 4/1996 |
| JP | 11-114496 | | 4/1999 |
| JP | 11-234943 | | 8/1999 |
| JP | 2003-143799 | | 5/2003 |
| JP | 2006288010 A | * | 10/2006 |
| WO | 2005064770 A1 | * | 7/2005 |
| WO | WO 2005/064770 A1 | | 7/2005 |
| WO | 2005099067 A1 | * | 10/2005 |

* cited by examiner

SURFACE MOUNT TYPE VIBRATION MOTOR AND FIXATION STRUCTURE

TECHNICAL FIELD

This invention relates to a vibration motor applicable to a solder reflow process, more specifically a surface mount type vibration motor provided with a motor holder made of metal and soldered to a circuit board.

BACKGROUND ART

Many small surface mount type electronic parts applicable to a solder reflow process are conventionally adopted as circuit parts mounted on electronic devices. Each of these small electronic parts is placed in a specified location on a circuit board printed with cream solder by a mounting device and collectively heat treated in a furnace for installation on a circuit board with molten solder.

In a manner similar to the above electronic parts, a vibration generation device (hereafter referred to as "vibration motor") used for mobile phones is also installed in a specified location on a circuit board by a solder reflow process, and a surface mount type vibration motor is attracting attention as a device applicable to the reflow process (for example, as set forth in Japanese Patent Publication Nos. JP11-234943A and JP2003-143799A).

SUMMARY OF THE INVENTION

On the other hand, a surface mount type vibration motor larger in size than other electronic parts with an eccentric weight and a high specific gravity results in a heavy total weight. In addition, a longitudinal dimension of a vibration motor body must be reduced to satisfy the requirement for size reduction for a mounted device, and when mounting on a circuit board surface, an extremely heavy eccentric weight attached to an output shaft causes an imbalance depending on a shape of a motor holder, further making it difficult to retain the motor body on a plane.

The vibration motor is provided with a mechanism for rotating a semicircular weight with an eccentric center of gravity attached to the output shaft of a motor to utilize the centrifugal force of the eccentric weight made of alloy with a high specific gravity in order to generate high vibration. Therefore, the center of gravity of the motor body with an attached eccentric weight deviating to the weighted side makes it difficult to stably install the motor body, creating the possibility that the body will tilt in the same direction as the downward movement of the center of gravity of the eccentric weight due to a small vibration during movement inside a solder reflow furnace.

Moreover, after the solder reflow process, if a mobile phone or similar electronic device is dropped, the parts of the vibration motor are subjected to a shock load in proportion to the mass of the eccentric weight. Therefore, the resulting potential problem is peeling of the soldered portion from the shock compared with other lighter electronic parts. In addition to the shock load from being dropped, when a gyrating force of the eccentric weight is large, the solder bonded surface may be affected over time, thus it is necessary to develop a shape or a structure of the motor holder for bonding the motor body wherein the motor body will tend to tilt due to the centrifugal force of the rotating eccentric weight.

The purpose of this invention is to provide a surface mount type vibration motor that is stably mounted on a circuit board by changing a design of a partial shape of a soldered motor holder without changing a design of a vibration motor body and that secures a sufficient soldering area to prevent the soldered portion of the motor holder from peeling off the circuit board.

In order to solve the above-described problems, the invention provides a surface mount type vibration motor comprising a vibration motor body where an eccentric weight is attached to an output shaft end, a motor holder for supporting a barrel of the vibration motor body, pedestals for supporting the motor holder so that an output shaft of the vibration motor body is parallel with the board surface on which the vibration motor body is mounted, and power supply terminals electrically connected by soldering to power supply lands of the circuit board for energizing a drive mechanism inside the vibration motor body, wherein the pedestals of the motor holder are in contact with stationary lands of the circuit board surface and are provided with support plates extending in an axial direction of the output shaft as parts of the pedestals, end portions of the support plates are arranged between the center of gravity of the eccentric weight and an end surface of the eccentric weight along the axial direction, and the support plates are not arranged in a position where the distance between the eccentric weight and the circuit board is minimum.

The present invention also provides a surface mount type vibration motor wherein surfaces of the support plates in contact with the circuit board are soldered to stationary lands of the circuit board.

The present invention also provides a surface mount type vibration motor wherein an elastic member is provided between a barrel of the vibration motor body and the motor holder.

The present invention produces the effect that the end portions of support plates for pedestals of the motor holder prevent the vibration motor body from tilting in the same direction as the downward movement of the center of gravity of the eccentric weight, which enables stable installation of the vibration motor on the circuit board when mounting the vibration motor on the circuit board. In addition, it is possible to allow the support plates to bear an external force generated by the eccentric weight to keep the axis of the output shaft parallel with the circuit board surface.

The present invention enables the end portions of the support plates to keep the output shaft parallel with the circuit board by arranging the end portions of the support plates in the above-described positions when the vibration motor body is subjected to a force that acts to move the end of the output shaft, namely the eccentric weight, toward the circuit board, for example, a force that acts to allow the vibration motor body to tilt in the same direction as the downward movement of the center of gravity of the eccentric weight.

At the same time, the present invention results in an effect that a gyrating force generated by rotation of the eccentric weight of the vibration motor is efficiently transmitted to the bonded circuit board to obtain a vibration force during a rotation motion of the vibration motor.

The present invention according also increases the strength of the bonding between the surface mount type vibration motor and the circuit board, contributes to enlarging an area to be soldered with the circuit board, and prevents the vibration motor from peeling off the circuit board due to the increase in the bonding strength and a decrease in the influence from the external force.

The present invention further increases the strength of bonding and stabilization between the surface mount type vibration motor and the circuit board because all areas of the support plates are soldered to the circuit board compared with a vibration motor where the pedestals are partially soldered to the circuit board.

The present invention also results in an effect that an external force transmitted to the vibration motor body is reduced by placing an elastic member between the barrel of the vibration motor motor body from the motor holder to the circuit board through the elastic member provided between the barrel of the vibration motor body and the motor holder. Vibration generated by the vibration motor rotation is efficiently transmitted through the portions where the pedestals of the motor holder are soldered to the circuit board.

In other words, this invention enables stable installation of a vibration motor on a circuit board by changing a design of the shape of a part of a soldered motor holder without changing a design of a vibration motor body, secures a sufficient soldering area, and prevents the circuit board from peeling off the soldered pedestals. In addition, the vibration of the vibration motor is transmitted to the circuit board.

The preferred embodiments of a surface mount type vibration motor, according to this invention is hereafter described while referring to drawings.

Figure 1:
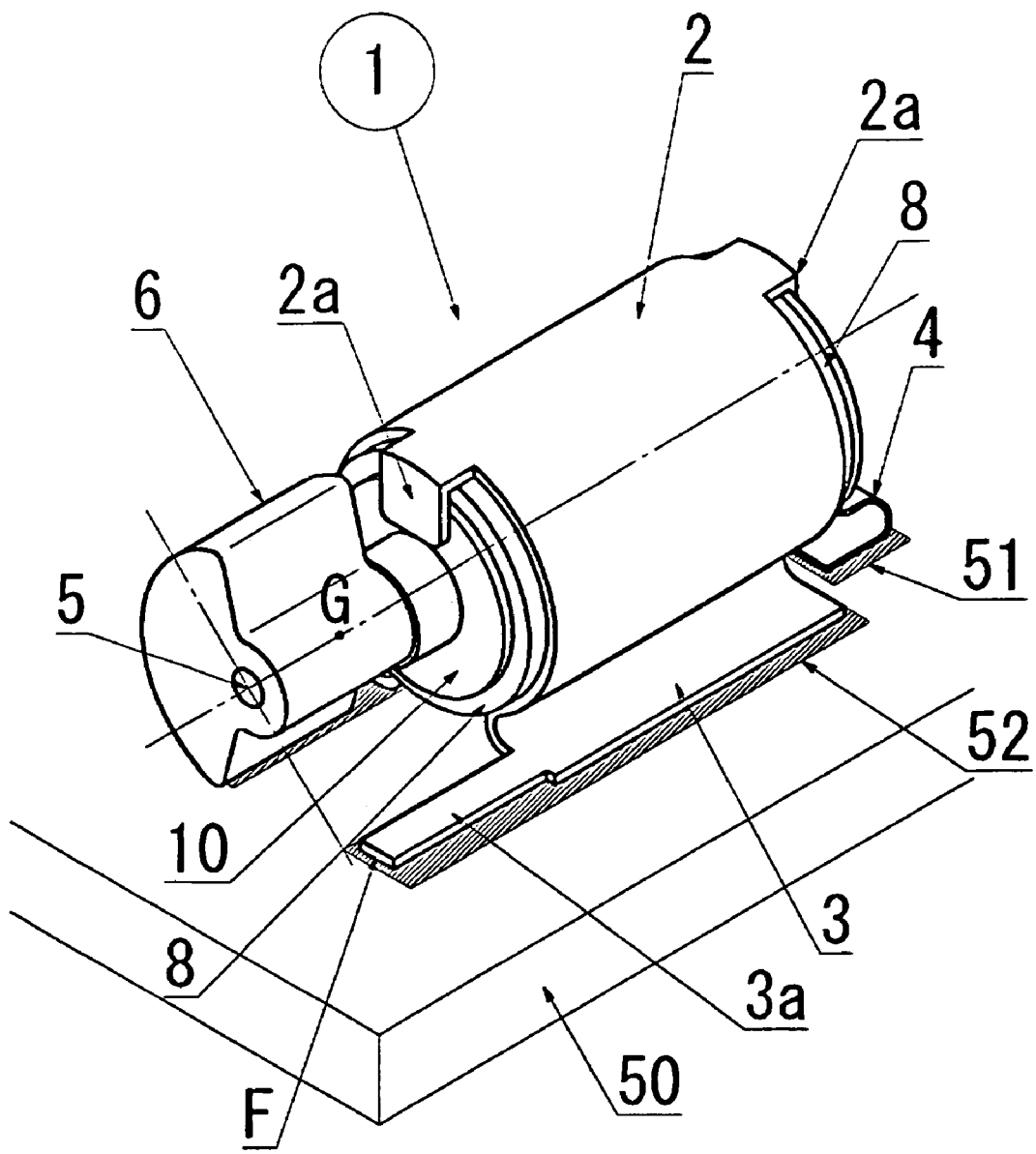
FIG. 1 is a perspective view showing an embodiment of a surface mount type vibration motor according to the invention.
Figure 2:
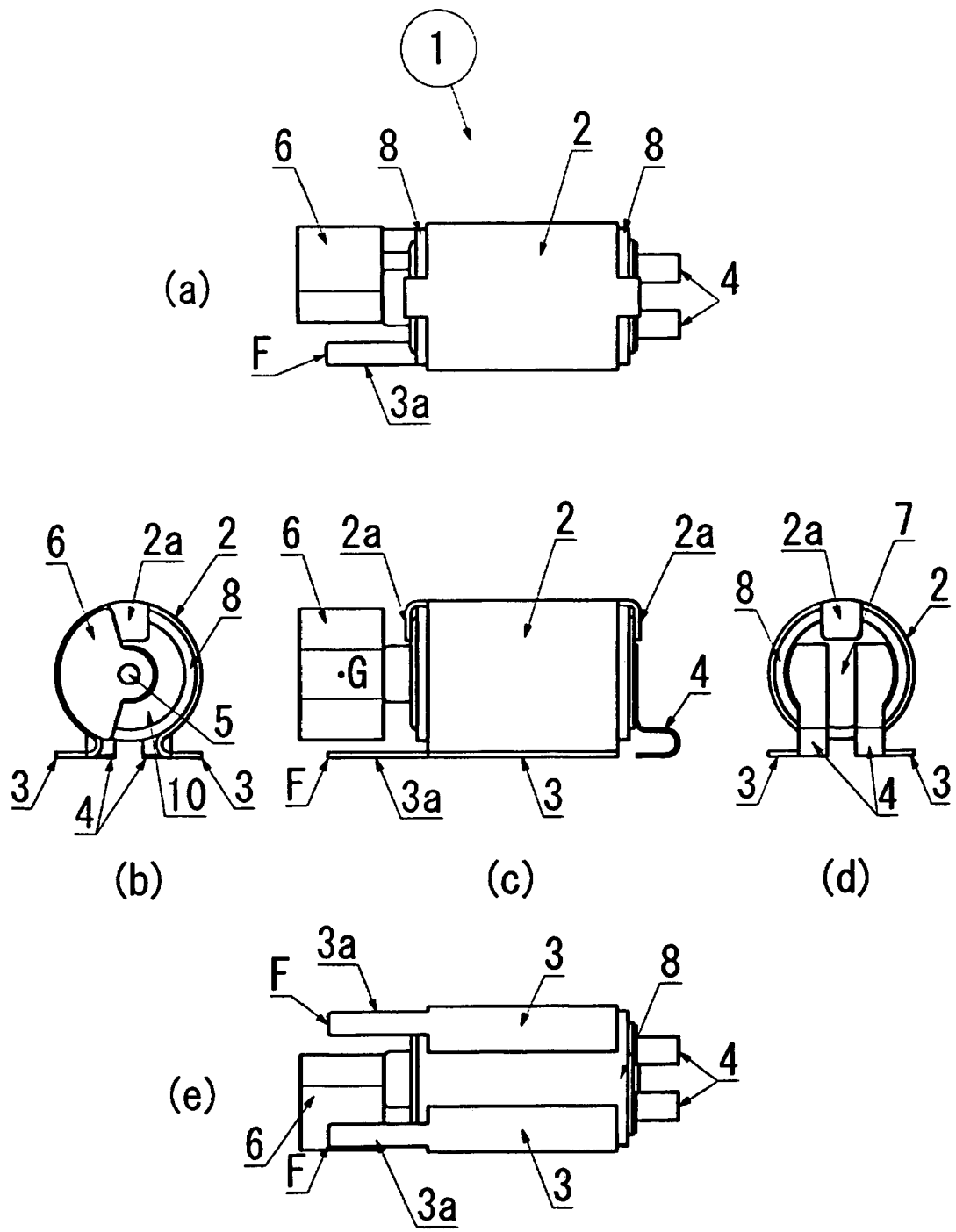
FIG. 2 is a five-face view showing the embodiment of the surface mount type vibration motor according to the invention.

A surface mount type vibration motor 1 according to this embodiment shown in FIGS. 1 and 2 is a surface mount component reflow soldered on a circuit board 50 with a bonding section printed with cream solder. This surface mount type vibration motor 1 comprises an eccentric weight 6, an almost cylindrical motor barrel 10 enclosing a vibration motor body, and a motor holder 2 for holding the motor barrel 10.

The eccentric weight 6 is attached to an output shaft 5 of the motor body with an almost fan-like cross section in a plane perpendicular to the axis of the output shaft 5 as shown in the drawings.

Another end of the motor barrel 10 is attached with an end bracket 7 as shown in FIG. 2 (d), and an outer surface of this end bracket 7 is provided with a pair of power supply terminals 4 electrically connected to brush pieces that slidably contact a commutator of a rotor inside the vibration motor body. The terminal pieces of the power supply terminals 4 are partially provided with flat sections that are bent and extended along the circuit board surface as shown in FIG. 2 (c).

A sheet-like elastic member 8 made of, for example, heat resistant silicone rubber for covering the motor barrel 10 is wound around an outer periphery of the motor barrel 10, and the motor holder 2 is installed over the elastic member 8.

This motor holder 2 is integrally provided with stoppers 2a that are arranged at both axial ends and bent to retain the motor barrel 10 in order to secure the axial mounting position of the vibration motor body.

The bottom of the motor holder 2 is provided with pedestals 3 that extend along the surface of the circuit board 50 in the lateral direction of the vibration motor body and are axially arranged in parallel with each other, and the eccentric weight 6 sides of the pedestals 3 are integrally formed with axially extending support plates 3a as shown in FIG. 1.

When the surface mount type vibration motor 1 held by the motor holder 2 and provided with pedestals 3 and support plates 3a of the motor holder 2 thereunder is placed on the circuit board 50, the entire vibration motor 1 held by the motor holder 2 is stably retained on the surface of the circuit board 50 in a manner where the circuit board 50 is parallel with the axis of the output shaft 5.

At this time, the end portions F of the support plates 3a are axially positioned between the center of gravity G of the eccentric weight 6 over the circuit board 50 and the distal end of the eccentric weight 6 as shown in FIGS. 1 and 2 (c). If the end portions F are positioned close to the motor body apart from the center of gravity G of the eccentric weight, there is a possibility that the motor body will tilt. On the other hand, if the end portions F are positioned beyond the distal end of the eccentric weight 6, dimensional limitations of the entire motor make it difficult to reduce the size.

At the same time, the support plates 3a are designed so as not to be arranged in a position just under the output shaft where the outer diameter of the rotating eccentric weight 6 comes closest to the circuit board 50. It is preferable to arrange the support plates 3a in positions apart from the area where the distance between the outer diameter of the rotating eccentric weight 6 and the circuit board 50 is minimum, namely at both sides of a position just under the output shaft as shown in FIG. 2 (e). The reason is that, for a small size vibration motor, the arrangement of the support plates 3a apart from the area just under the output shaft is more effective than a reduction in the outer diameter of an eccentric weight since the larger diameter of the eccentric weight 6 provides greater vibration amplitude at the same rotation speed of the weight.

The pedestals 3 and the support plates 3a of the circuit board 50 in contact with stationary lands 52 printed with cream solder are subjected to a solder reflow process to bond the pedestals 3 and the support plates 3a with the lands 52 so that the entire motor holder 2 enclosing the vibration motor body is soldered and mounted on the circuit board 50 as shown in FIG. 1. At the same time, the power supply terminals 4 are also soldered and mounted on power supply lands 51 of the circuit board 50.

Functions and effects of this embodiment are described below:

As aforementioned, since the vibration motor is larger in size compared with other general electronic components and has the eccentric weight 6 with a high specific gravity, the entire device is heavy in weight. For example, when the vibration motor is placed on the surface of the circuit board 50, the extremely heavy eccentric weight 6 attached to the output shaft 5 unbalances the vibration motor depending on the shape of the motor holder 2 to allow the vibration motor to tilt in the same direction as the downward movement of the center of gravity of the eccentric weight 6. Thus, there frequently arose problems where it was difficult to retain the vibration motor on the plane of the circuit board 50.

On the other hand, the end portions of the pedestals 3 of the motor holder 2 installed with the surface mount type vibration motor 1 according to this embodiment are additionally provided with support plates 3a in order to prevent the vibration motor body from tilting in the same direction as the downward movement of the center of gravity of the eccentric weight 6 as shown in FIGS. 1 and 2.

A vibration motor fundamentally generates an unbalanced centrifugal force by rotating a semi-cylindrical eccentric weight made of alloy with a high specific gravity attached to an output shaft of a motor body. Therefore, problems occur when the center of gravity of the motor body with an attached eccentric weight deviating to the weight side makes it difficult to stably install a motor body, with a possibility that the body will tilt in the same direction as the downward movement of the center of gravity of the eccentric weight due to a small vibration during movement inside a solder reflow furnace. On the other hand, the surface mount type vibration motor 1 according to this embodiment is stably mounted on the circuit board.

In addition, when a mobile phone or similar electronic device is dropped after the solder reflow process, parts of a vibration motor are subjected to a shock load in proportion to the mass of an eccentric weight. In this case, peeling from the bonded surface is prevented as in other light electronic components because of a large effective area for soldering.

Similar to the shock load from being dropped, when rotation of an eccentric weight generates a large gyrating force, a solder-bonded surface may be affected over time. In this case, stable retaining strength is obtained from the design of a structure for preventing the motor body from tilting in the same direction as the downward movement of the center of gravity of the eccentric weight, along with support plates capable of avoiding interference with the rotating eccentric weight.

Thus, the surface mount type vibration motor 1 according to this embodiment is stably mounted on a circuit board by changing the design of a partial shape of a soldered motor holder without changing the design of a vibration motor body and securing a sufficient soldering area to prevent the soldered portion of the motor holder from peeling off the circuit board.

It is therefore apparent that there has been provided, in accordance with the present invention, a surface mount type vibration motor. While this invention has been described in conjunction with a preferred embodiment, it is evident that many alternatives, modifications, and variations would be or are apparent to those of ordinary skill in the application arts. Accordingly, the disclosure is intended to embrace all such alternatives, modifications, equivalents any variations that are within the spirit and scope of this invention.

The invention claimed is:

1. A surface mount type vibration motor mounted on a board surface of a circuit board comprising:
    a vibration motor body where an eccentric weight is attached to an output shaft end,
    a motor holder for holding a barrel of said vibration motor body, pedestals for supporting said motor holder so that an output shaft of said vibration motor body is parallel with said board surface on which said vibration motor body is mounted, and
    power supply terminals electrically connected by soldering to power supply lands of said circuit board for energizing a drive mechanism inside said vibration motor body,
    wherein said pedestals of said motor holder are spaced apart along a length of said motor body and are in contact with stationary lands of said circuit board, each of said pedestals are provided with a support plate extending in an axial direction of said output shaft, the ends of said support plates being out of contact with one another along their length and are arranged between a center of gravity of said eccentric weight and an end surface of said eccentric weight along said axial direction, and said support plates are not arranged along their length in a position where a distance between said eccentric weight and said circuit board is a minimum.

2. A surface mount type vibration motor according to claim 1, wherein surfaces of said support plates in contact with said circuit board are soldered to stationary lands of said circuit board.

3. A surface mount type vibration motor according to claim 1, wherein an elastic member is provided between a barrel of said vibration motor body and said motor holder.

* * * * *